(12) United States Patent
De Sousa et al.

(10) Patent No.: US 10,880,988 B2
(45) Date of Patent: Dec. 29, 2020

(54) HIGHLY THERMALLY CONDUCTIVE DIELECTRIC STRUCTURE FOR HEAT SPREADING IN COMPONENT CARRIER

(71) Applicant: AT&S Austria Technologie & Systemtechnik Aktiengesellschaft, Leoben (AT)

(72) Inventors: Jonathan Silvano De Sousa, Vienna (AT); Hannes Voraberger, Graz (AT); Markus Leitgeb, Trofaiach (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/364,013

(22) Filed: Mar. 25, 2019

(65) Prior Publication Data
US 2019/0223285 A1 Jul. 18, 2019

Related U.S. Application Data

(63) Continuation-in-part of application No. PCT/EP2017/074468, filed on Sep. 27, 2017.

(30) Foreign Application Priority Data

Sep. 27, 2016 (DE) .......... 10 2016 118 275

(51) Int. Cl.
*H05K 3/36* (2006.01)
*H05K 1/02* (2006.01)
(Continued)

(52) U.S. Cl.
CPC .......... *H05K 1/0209* (2013.01); *H01L 23/15* (2013.01); *H01L 23/3735* (2013.01);
(Continued)

(58) Field of Classification Search
CPC .... H05K 1/0209; H05K 1/0203; H05K 1/036; H05K 3/4655; H01L 23/3735; H01L 23/15; Y10T 29/49126; Y10T 29/49155
(Continued)

(56) References Cited

U.S. PATENT DOCUMENTS 4,675,784 A 6/1987 Dahlberg et al.
5,857,767 A * 1/1999 Hochstein ................ G09F 9/33
362/294
(Continued)

FOREIGN PATENT DOCUMENTS

DE 10 2012 108 719 A1 3/2014
EP 1 909 321 A1 4/2008
(Continued)

*Primary Examiner* — Donghai D Nguyen
(74) *Attorney, Agent, or Firm* — Robert A. Blaha; Smith Tempel Blaha LLC

(57) ABSTRACT

A manufacturing method of manufacturing a constituent for a component carrier, wherein the method comprises providing an electrically conductive structure, forming a highly thermally conductive and electrically insulating or semiconductive structure on the electrically conductive structure, subsequently, and attaching a thermally conductive and electrically insulating structure, having a lower thermal conductivity than the highly thermally conductive and electrically insulating or semiconductive structure, on an exposed surface of the highly thermally conductive and electrically insulating or semiconductive structure.

15 Claims, 3 Drawing Sheets

(51) Int. Cl.
*H01L 33/62* (2010.01)
*H05K 1/03* (2006.01)
*H01L 23/15* (2006.01)
*H01L 23/373* (2006.01)
*H01L 33/64* (2010.01)
*H05K 1/18* (2006.01)
*H05K 3/46* (2006.01)
*H05K 3/02* (2006.01)
*H01L 33/60* (2010.01)

(52) U.S. Cl.
CPC .......... *H01L 33/62* (2013.01); *H01L 33/647* (2013.01); *H05K 1/0203* (2013.01); *H05K 1/036* (2013.01); *H05K 1/181* (2013.01); *H05K 1/182* (2013.01); *H05K 3/4655* (2013.01); *H01L 23/3731* (2013.01); *H01L 23/3732* (2013.01); *H01L 33/60* (2013.01); *H01L 33/641* (2013.01); *H01L 33/642* (2013.01); *H01L 2933/0066* (2013.01); *H01L 2933/0075* (2013.01); *H05K 1/0306* (2013.01); *H05K 3/022* (2013.01); *H05K 3/4602* (2013.01); *H05K 3/4605* (2013.01); *H05K 2201/0108* (2013.01); *H05K 2201/0195* (2013.01); *H05K 2201/10106* (2013.01); *H05K 2203/0152* (2013.01)

(58) Field of Classification Search
USPC .................................................. 29/830, 846
See application file for complete search history.

(56) References Cited

U.S. PATENT DOCUMENTS

| | | | |
|---|---|---|---|
| 6,841,080 B2 * | 1/2005 | Kingon | .................. H05K 1/162 |
| | | | 29/25.03 |
| 9,089,050 B2 * | 7/2015 | Kajiya | ................. H05K 1/0206 |
| 10,359,181 B2 * | 7/2019 | Konishi | .................. F21V 23/06 |
| 2008/0173388 A1 | 7/2008 | Cheng et al. | |
| 2009/0266599 A1 | 10/2009 | Kan et al. | |
| 2016/0233401 A1 | 8/2016 | Konishi et al. | |

FOREIGN PATENT DOCUMENTS

| | | |
|---|---|---|
| EP | 2 490 513 A2 | 8/2012 |
| JP | H04 255254 A | 9/1992 |
| WO | WO 2005/065274 A2 | 7/2005 |

\* cited by examiner

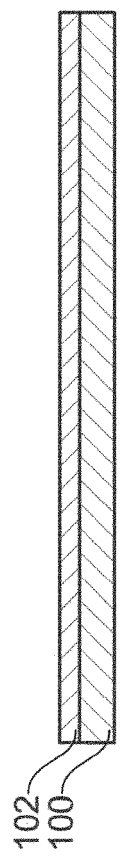
Fig. 1
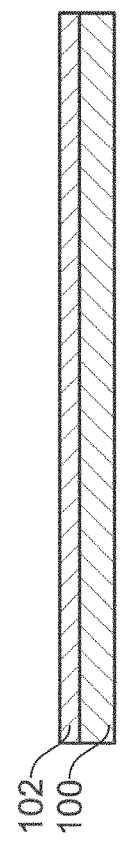
Fig. 5
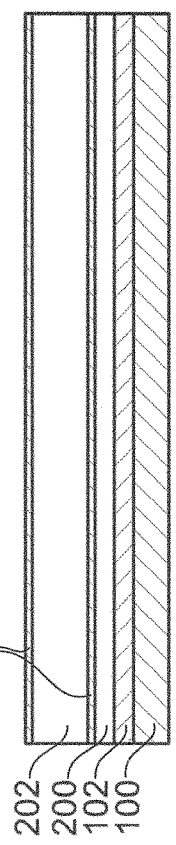
Fig. 2
Fig. 6
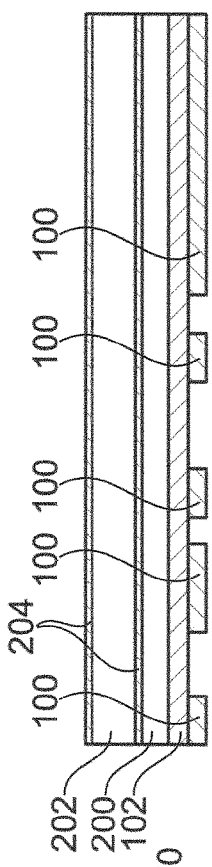
Fig. 3
Fig. 7
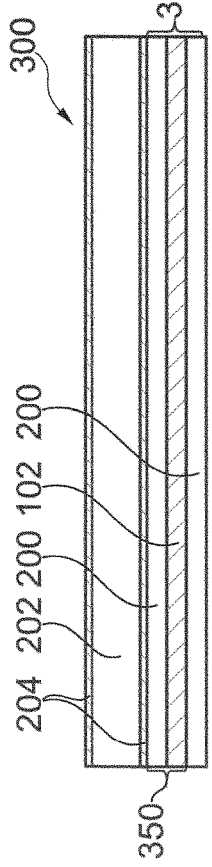
Fig. 4
Fig. 8
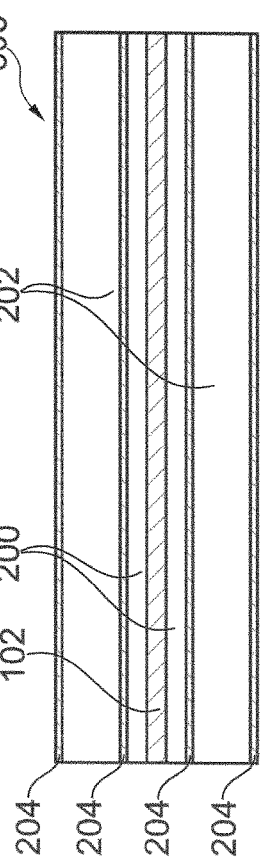
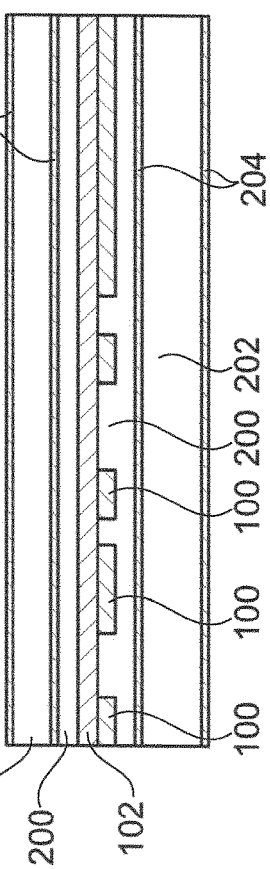

US 10,880,988 B2

HIGHLY THERMALLY CONDUCTIVE DIELECTRIC STRUCTURE FOR HEAT SPREADING IN COMPONENT CARRIER

TECHNICAL FIELD

The invention relates to a manufacturing method and to a method of manufacturing a component carrier. Furthermore, the invention relates to a constituent for a component carrier, to a component carrier, and to a method of use.

TECHNOLOGICAL BACKGROUND

Along with the development of electronic industries, electronic products have a trend towards miniaturization and high performance, and accordingly multi-layer boards are developed so as to meet demands for high-density integrated circuits and meanwhile reduce the thickness of packaging substrates. In modern applications of component carrier technology, sophisticated electronic functionality is implemented. This also involves high power density and high voltage applications. Thus, significant amounts of heat can be generated by one or more components mounted on and/or embedded within a component carrier such as a printed circuit boards (PCB). This may have an impact on reliability.

Conventional PCBs rely on FR4 and copper as heat spreading structures. FR4 serves as mechanical body and dielectric in PCB build up. Although FR4 is thermally conductive to a certain extent, its heat conductivity is not very high (typically around 0.5 W/mK). For that reason, the heat is mainly dissipated via the copper structures.

However, it can happen in the scenario of modern printed circuit board applications with sophisticated electronic functionality and a high integration density of electrically conductive structures that the printed circuit boards and/or components mounted thereon and/or therein are significantly heated during operation and are not capable of removing the generated heat in a sufficient manner. This results in reliability problems and the danger of overheating.

SUMMARY

There may be a need enable the manufacture of reliable component carriers with reasonable manufacturing effort.

A manufacturing method, a method of manufacturing a component carrier, a constituent for a component carrier and a component carrier according to the independent claims are provided.

According to an exemplary embodiment of the invention, a manufacturing method of manufacturing a constituent for a component carrier is provided which comprises providing an electrically conductive structure, forming a highly thermally conductive and electrically insulating or semiconductive structure on the electrically conductive structure, and subsequently attaching a thermally conductive and electrically insulating structure, having a lower thermal conductivity than the highly thermally conductive and electrically insulating or semiconductive structure, on an exposed surface of the highly thermally conductive and electrically insulating or semiconductive structure. Optionally, it is possible to remove (in particular after the attaching) at least part of the electrically conductive structure.

According to another exemplary embodiment of the invention, a method of manufacturing a component carrier for carrying at least one component is provided, wherein the method comprises forming at least one constituent of the component carrier by carrying out a manufacturing method having the above-mentioned features, and forming a laminated stack of a plurality of electrically conductive layer structures and a plurality of electrically insulating layer structures, wherein at least one of the electrically insulating layer structures is provided by at least part of the at least one constituent.

According to still another exemplary embodiment of the invention, a constituent for a component carrier is provided, wherein the constituent comprises or consists of a highly thermally conductive and electrically insulating or semiconductive structure, and a thermally conductive and electrically insulating structure, having a lower thermal conductivity than the highly thermally conductive and electrically insulating or semiconductive structure, attached on a surface of the highly thermally conductive and electrically insulating or semiconductive structure. When—optionally—the constituent additionally comprises an electrically conductive structure on the highly thermally conductive and electrically insulating or semiconductive structure, the constituent may consist of only the highly thermally conductive and electrically insulating or semiconductive structure, the thermally conductive and electrically insulating structure, and the electrically conductive structure.

According to yet another exemplary embodiment of the invention, a component carrier for carrying at least one component is provided, wherein the component carrier comprises a plurality of electrically conductive layer structures, and a plurality of electrically insulating layer structures, wherein the plurality of electrically conductive layer structures and the plurality of electrically insulating layer structures form a laminated stack, and wherein at least one of the electrically insulating layer structures is configured as or comprises at least part of a constituent having the above-mentioned features.

According to yet another exemplary embodiment of the invention, one or more constituents having the above-mentioned features is or are used to substitute one or more thermally conductive and electrically insulating layer structures when designing a component carrier.

OVERVIEW OF EMBODIMENTS

In the context of the present application, the term "highly thermally conductive and electrically insulating or semiconductive structure" may particularly denote structures of dielectric or semiconductor materials (i.e., materials which do not show electrical conductivity of metals) having a value of the thermal conductivity of at least 8 W/mK, in particular at least 10 W/mK, more particularly at least 50 W/mK. A ratio between the thermal conductivity of the highly thermally conductive and electrically insulating or semiconductive structure on the one hand and the thermally conductive and electrically insulating structure on the other hand may be at least 3, in particular at least 5, more particularly at least 10. Such values of the thermal conductivity are significantly better than the thermal conductivity of conventionally used thermally conductive and electrically insulating materials (for instance FR4: ≈0.5 W/mK) of component carriers such as printed circuit boards, which therefore significantly improves the heat removal or spreading from the component carrier during operation of the component carrier with components (such as packaged semiconductor chips, etc.) mounted thereon.

In the context of the present application, the term "sacrificial structure" may particularly denote a temporary base structure or an auxiliary structure which does not necessarily or not entirely form part of a readily manufactured component carrier but is mainly used during its manufacturing process as a sufficiently robust base or support for forming a highly thermally conductive and electrically insulating layer structure thereon, and which may be capable of withstanding high temperature conditions which may be involved in the manufacture of a highly thermally conductive and electrically insulating layer structure. After having formed the highly thermally conductive and electrically insulating layer structure and after having connected the latter to an electrically insulating layer structure, the sacrificial structure can be either used again for manufacturing further constituents for component carriers, may remain at least partially part of the readily manufactured component carrier, or may be disposed or removed completely, i.e. sacrificed.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

According to an exemplary embodiment of the invention, a method of manufacturing a constituent for a component carrier is provided which can be used for efficiently preventing overheating of the component carrier during operation, even in the presence of sophisticated electronic functionality of the component carrier and/or a high integration density. This is accomplished by sandwiching also a highly thermally conductive electrically insulating structure within the component carrier which serves for an efficient removal of heat thanks to its high thermal conductivity and may also contribute to heat spreading. However, not many materials are available which are at the same time capable of reliably electrically insulating and of providing a high thermal conductivity. Many of the few materials which are capable of fulfilling these two tasks and being simultaneously compatible with requirements of component carrier technology (in particular printed circuit board technology) however require quite extreme conditions for being manufactured. In particular, ceramic layers need a very high temperature when being formed, for instance by deposition. Such temperatures may significantly exceed the maximum temperature which electrically insulating structures such as prepreg used for component carrier technology can withstand without deterioration or damage. For instance, the high temperatures involved in the deposition of highly thermally conductive and electrically insulating or semiconductive structures may undesirably trigger at least partial cross-linking of the resin of the prepreg material as an example for a thermally conductive and electrically insulating structure. When such cross-linking and/or melting occurs during deposition of a highly thermally conductive and electrically insulating or semiconductive structure on the thermally conductive and electrically insulating structure, this may negatively influence the capability of the thermally conductive and electrically insulating structure of contributing to the connection between different elements of the component carrier by lamination. Exemplary embodiments of the invention overcome this problem by using an electrically conductive structure as a sacrificial structure which is used as a basis or support for depositing or, more generally, forming the highly thermally conductive and electrically insulating or semiconductive structure thereon and being, as a metallic material, usually fully compatible with the high deposition temperatures. When the deposition procedure is completed, the thermally conductive and electrically insulating structure may be connected to the highly thermally conductive and electrically insulating or semiconductive structure, in particular by lamination, and, if desired, the sacrificial structure of the electrically conductive structure may be partially or fully removed. The result of this procedure is a double layer of a properly laminable thermally conductive and electrically insulating layer structure and a highly thermally conductive and electrically insulating layer structure having excellent properties in terms of heat spreading and heat removal. Hence, when the formation procedure of forming the highly thermally conductive and electrically insulating or semiconductive structure is completed and the temperature may be reduced again below a critical maximum temperature which the thermally conductive and electrically insulating structure can withstand, a connection between the double structure of electrically conductive structure and highly thermally conductive and electrically insulating or semiconductive structure on the one hand and a thermally conductive and electrically insulating structure on the other hand may be accomplished. After that, the electrically conductive structure may be removed either only partially (so that it can later be used for example as a patterned electrically conductive structure to provide a wiring functionality in the component carrier to be manufactured) or completely (so that the resulting double structure of highly thermally conductive and electrically insulating or semiconductive structure and thermally conductive and electrically insulating structure on the other hand can be advantageously used as a purely dielectric constituent for a component carrier which can be used instead or which can replace a conventional electrically insulating layer structure such as a pure prepreg layer). By the provided manufacturing technology, it is possible to manufacture component carriers with high reliability due to a proper capability of removing heat during operation. At the same time, there is a high degree of flexibility of selecting materials for the highly thermally conductive and electrically insulating or semiconductive structure in view of its above described manufacturing. The formation of such highly thermally conductive and electrically insulating or semiconductive structures on another thermally conductive and electrically insulating structure is then no longer limited to materials which are compatible with maximum temperature conditions under which directly adjacent thermally conductive and electrically insulating structures, such as prepreg, may withstand. Furthermore, the mechanical integrity of a corresponding laminated stack constituting a component carrier may be improved.

More specifically, one idea of an exemplary embodiment is to use copper as sacrificial layer to avoid high temperatures on FR4 materials during coating with highly thermally conductive material. The coating temperatures can be problematic already at 280° C. Therefore, using copper or any other material that can withstand higher temperatures in order to achieve a good crystalline structure for highly thermally conductive ceramic material or the like provides both good thermal conductivity and integrity of the manufactured structure. Experiments have shown to reach 7 W/mK or more at reduced temperature for coating directly on an FR4 substrate.

In the following, further exemplary embodiments of the manufacturing method, the method of manufacturing a component carrier, the constituent for a component carrier, the component carrier, and the method of use will be explained.

In an embodiment, the highly thermally conductive and electrically insulating or semiconductive structure is formed to fully or partially cover the electrically conductive structure. Hence, both a continuous layer or a patterned layer of the highly thermally conductive and electrically insulating or semiconductive structure (such as AlN) may be applied on the electrically conductive structure.

In an embodiment, the thermally conductive and electrically insulating structure comprises a resin matrix, in particular an epoxy resin matrix, with embedded fibers, in particular with embedded glass fibers. Such a previously uncured material (which may also be denoted as B-stage prepreg) can be cured (in particular may be melted and subsequently solidified) upon lamination and may thereby form a connection with the adjacent highly thermally conductive and electrically insulating or semiconductive structure.

In an embodiment, the highly thermally conductive and electrically insulating or semiconductive structure is formed on the electrically conductive structure at a high temperature which is incompatible with integrity of the thermally conductive and electrically insulating structure, in particular at a temperature above 300° C. For example, formation of the highly thermally conductive and electrically insulating or semiconductive structure may involve temperatures above 300° C., in particular above 400° C., for instance by formation using chemical vapor deposition. In contrast to this, the maximum temperature at which thermally conductive and electrically insulating circuit board material (such as prepreg) starts to cross-link or to melt may be lower. Therefore, with such a constellation, it would be impossible to form a double layer of prepreg on the one hand and a ceramic (such as a metal oxide or a metal nitride) on the other hand by a direct deposition of the ceramic on the prepreg without deteriorating lamination performance of the prepreg.

In an embodiment, the highly thermally conductive and electrically insulating or semiconductive structure is formed on the electrically conductive structure by at least one of the group consisting of sputtering, physical vapor deposition, chemical or physical vapor deposition, plasma enhanced chemical vapor deposition, application of nanoparticles, sintering, and electric arc deposition. By such deposition methods, reliable and homogenous highly thermally conductive and electrically insulating materials such as ceramics can be deposited. However, these procedures may involve temperatures which are incompatible with thermally conductive and electrically insulating material used for component carrier technology, such as FR4/prepreg.

In an embodiment, the attaching is accomplished by lamination. Lamination may be defined as a connection technology which applies pressure and increased temperature to a layer stack of the thermally conductive and electrically insulating layer structure, the highly thermally conductive and electrically insulating layer structure, the electrically conductive layer structure, etc., to connect them. The actual connection may be triggered by curing material of the thermally conductive and electrically insulating layer structure, for instance temperature and pressure triggered cross-linking of resin material of such thermally conductive and electrically insulating material (which may previously be in a so-called bi-stage). The constituent may be of a layer type, so as to be highly appropriate for such a lamination procedure.

In an embodiment, the highly thermally conductive and electrically insulating or semiconductive structure is formed as a thin layer, in particular with a thickness of less than or equal to 10 µm, more particularly with a thickness of less than or equal to 5 µm, even more particularly with a thickness in a range between 100 nm and 5 µm. It has turned out that already layers of the mentioned small thicknesses are capable of efficiently removing heat during operation and additionally do not disturb the general physical properties of the component carrier which may be dominated by copper as electrically conductive material and prepreg/FR4 (i.e. a mixture of resin and glass fibers) on the other hand. Configuring the highly thermally conductive and electrically insulating or semiconductive structure from such thin layers will also have the positive impact that the coefficient of thermal expansion (CTE) will not be significantly influenced by the additional highly thermally conductive and electrically insulating material. This reduces the tendency of warpage of and intrinsic mechanical stress in the component carrier.

In an embodiment, the electrically conductive structure is removed completely, in particular by etching (see FIG. 2 and FIG. 3). In this embodiment, the electrically conductive structure serves merely as a sacrificial layer which does not form part of the final component carrier. The electrically conductive structure then provides the functionality of a robust and stable mounting base on which formation of the highly thermally conductive and electrically insulating or semiconductive structure can be performed with high reliability and without deterioration of any elements of the formed component carrier.

In another embodiment, the electrically conductive structure is patterned so that a patterned electrically conductive structure remains attached to the highly thermally conductive and electrically insulating or semiconductive structure, in particular by lithography and etching. In such an embodiment, the electrically conductive structure may synergistically fulfill two tasks: Firstly, it serves as a temperature-robust base or support for forming the highly thermally conductive and electrically insulating or semiconductive structure. Secondly, it may serve as a conductive trace in the final component carrier product. Advantageously, ceramic material such as metal oxides and metal nitrides (which may be used for the highly thermally conductive and electrically insulating or semiconductive structure) may be capable to withstand lithography and (in particular metal) etching procedures and are compatible to via formation (for instance by laser, mechanical drilling), as well as desmear and plating processes.

In an embodiment, the highly thermally conductive and electrically insulating or semiconductive structure on the electrically conductive structure comprises at least one of the group consisting of an inorganic material, a ceramic, a metal oxide, a metal carbide, a metal nitride, aluminum oxide, aluminum nitride, and diamond like carbon. Such materials have the advantageous effect that they may be manufactured in very thin layers and have a very high thermal conductivity while simultaneously showing a reliable dielectric property. Their integration in a component carrier such as a printed circuit board therefore meets all requirements and advantageous properties desired in such a component carrier.

In an embodiment, the thermally conductive and electrically insulating structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multilayer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, prior to the attaching, the thermally conductive and electrically insulating structure is connected to a fully cured structure (such as a core or a multi-layer), in particular to a fully cured structure covered with at least one electrically conductive layer structure. Such a fully cured structure may be a relatively thick base body, for instance made of already fully cured FR4 material, which provides high stability and robust-ness to ensure mechanical integrity of the component carrier to be manufactured during a lamination procedure. Such a fully cured structure of FR4 may be covered on one or both sides with a copper foil or any other electrically conductive layer structure. By implementing such a fully cured structure in the manufacturing procedure, the above-described constituent may be connected with the fully cured structure in the framework of a further build-up of the component carrier.

In an embodiment, the highly thermally conductive and electrically insulating or semiconductive structure is configured to be optically transparent, i.e. transmissive for light. This allows to implement the highly thermally conductive and electrically insulating or semiconductive structure in optical devices in which electromagnetic radiation such as visible light is intended to propagate through the optically transparent highly thermally conductive and electrically insulating or semiconductive structure. In particular the above described thin layers of a highly thermally conductive and electrically insulating or semiconductive structure show a proper transmissivity for light.

Correspondingly, the highly thermally conductive and electrically insulating or semiconductive structure being optically transparent may be arranged on top of one of the electrically conductive layer structures, in particular on an exterior surface of the component carrier. This electrically conductive layer structure may have an optically reflective, more particularly polished, upper surface. Such a combination may allow light to pass through the highly thermally conductive and electrically insulating or semiconductive structure and to be subsequently reflected upwardly on the reflective electrically conductive layer structure. Heat generated by the light source (for instance LEDs) may be removed rapidly and efficiently via the highly thermally conductive and electrically insulating or semiconductive structure.

In an embodiment, the electrically conductive structure is polished before forming the highly thermally conductive and electrically insulating or semiconductive structure. Polishing the electrically conductive structure prior to the formation of the highly thermally conductive structure has turned out to improve the adhesion of the latter structure on the former structure. Without wishing to be bound to a specific theory, it is presently believed that polishing the electrically conductive structure before the formation of the highly thermally conductive structure has a positive impact on the crystallinity of the latter.

In an embodiment, a light source, in particular a light-emitting diode, is arranged on top of the highly thermally conductive and electrically insulating or semiconductive structure and is exposed to an environment of the component carrier. Highly advantageously, thin layers of the mentioned highly thermally conductive and electrically insulating or semiconductive structures (for instance having a thickness below 100 nm, in particular below 10 nm, for example made of aluminum nitride or aluminum oxide) also show an optically transparent property. Thus, the optically transparent highly thermally conductive and electrically insulating layer structures may be used for instance on top of the component carrier to be manufactured to allow the transmission of light into an interior thereof. This for instance makes it possible that a reflective structure (such as an aluminum layer) is arranged directly beneath the optically transparent highly thermally conductive and electrically insulating layer structure and may reflect light propagating from an exterior of the component carrier through the optically transparent, highly thermally conductive and electrically insulating or semiconductive structure up to the reflecting layer. Such a configuration may for instance be advantageous in an application in which a light emitting diode or any other light source is mounted on top of the component carrier, so that the light emitted in a downward direction may be reflected back towards an application and increases the yield in terms of light energy. The optically transparent, highly thermally conductive and electrically insulating layer structure simultaneously ensures efficient removal of heat generated during operation of the light source.

In an embodiment, at least one of the electrically conductive layer structures is provided by part of at least one constituent. In particular, the constituent may further comprise a patterned electrically conductive structure on the highly thermally conductive and electrically insulating or semi-conductive structure. Such a patterned electrically conductive structure of the constituent may form part of the final component carrier.

In an embodiment, the component carrier has surface mounted there-on and/or embedded therein at least one component. The at least one component can be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the highly thermally conductive and electrically insulating or semiconductive structure is configured to (at least partially) suppress copper migration in the component carrier.

With respect to the technical field of power applications, it has emerged that common materials for building electrically insulating layers (for example FR4) may be not sufficient to prevent copper migration. Copper migration in turn may cause short circuits between electrically conductive (e.g. copper) layers or vias. This problem may in particular be observed in the surrounding of electric contacts of embedded (electronic) components in high power applications. It has now been surprisingly found that the problem of copper migration may be overcome (or can be at least efficiently reduced) by applying the highly thermally conductive and electrically insulating or semiconductive structure as described above. In this manner, the long-term reliability of a printed circuit board may be increased. Said long-term reliability may in particular be important with respect to e-mobility applications. The described positive effects may be further improved, when the highly thermally conductive and electrically insulating or semiconductive structure comprises a ceramic (layer) and/or when the highly thermally conductive and electrically insulating or semiconductive structure is configured as a (very) dense structure (e.g. in comparison to common electrically insulating layers such as FR4 material).

BRIEF DESCRIPTION OF THE DRAWINGS

FIG. 1, FIG. 2, FIG. 3 to FIG. 4 show cross-sectional views of structures obtained during performance of a method of manufacturing a component carrier according to an exemplary embodiment of the invention.

FIG. 5, FIG. 6, FIG. 7 to FIG. 8 show cross-sectional views of structures obtained during performance of a method of manufacturing a component carrier according to another exemplary embodiment of the invention.

DETAILED DESCRIPTION OF ILLUSTRATED EMBODIMENTS

Figure 9:
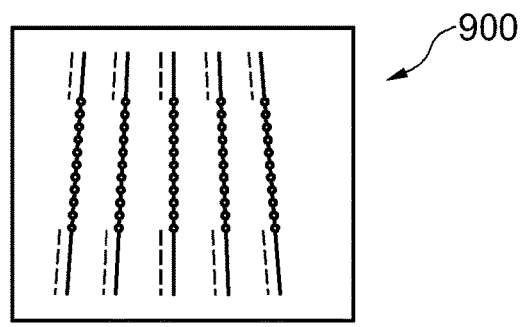
FIG. 9 shows a plan view of a semi-finished or readily manufactured product on panel level based on which component carriers according to an exemplary embodiment of the invention can be formed.

The aspects defined above and further aspects of the invention are apparent from the examples of embodiment to be described hereinafter and are explained with reference to these examples of embodiment.

The invention is described in more detail hereinafter with reference to examples of embodiment but to which the invention is not limited.

The illustrations in the drawings are schematically presented. In different drawings, similar or identical elements or features are provided with the same reference signs.

Before, referring to the drawing, exemplary embodiments will be de-scribed in further detail, some basic considerations will be summarized based on which exemplary embodiments of the invention have been developed.

According to an exemplary embodiment of the invention, heat spreading within a component carrier is improved using a sacrificial layer as a deposition base for a highly thermally conductive and electrically insulating or semiconductive structure such as a ceramic layer. More specifically, a fabrication method for inorganic or semiconductive dielectric heat spreading layers in a printed circuit board (PCB) using sacrificial layers is provided.

Ceramics (for example aluminum nitride and aluminum oxide), car-bides and diamond like carbon (DLC) may be used as heat sinks, especially for light-emitting diodes (LEDs) and power devices due to two characteristics of such materials. On the one hand, they are dielectric materials. On the other hand, they are very good thermal conductors. Nevertheless, the creation of thin ceramic layers that are compatible with PCB dimensions to be used as heat spreading layers involves a process that undergoes extreme temperatures. Even on sputtering processes (PVD, CVD, electric arc, etc.), process temperatures can reach over 300° C. As such temperature, commonly used PCB dielectrics such as prepreg may experience undesired phenomena such as reduction or loss of their capability of connecting structures by lamination.

Besides that, good thermal conductivity depends on the quality of the crystallinity of the ceramic layer. This property is strongly correlated to the parameters under which the ceramic material is deposited on a substrate (PECVD chamber pressure and substrate temperature, for example). These process characteristics turn the use of materials such as aluminum nitride, aluminum oxide and DLC difficult in the PCB build up.

However, according to an exemplary embodiment of the invention, a manufacturing method is provided which makes it possible to use thin film heat spreading dielectric layers or semiconductors that need to be synthetized via extreme processes at high temperatures that are incompatible with FR4 processes temperatures. In order to do that, a carrier material may be used that withstands the PVD process temperatures and that is compatible with the PCB manufacturing processes.

For example, copper foils can be used as a carrier for the introduction of aluminum nitride in the PCB. The foil can be coated fully or partially using a mask process with a thin layer of aluminum nitride (for example up to 5 μm) with PECVD (plasma enhanced chemical vapor deposition) coating techniques. In a second stage, the foil can be inserted in the PCB build up by pressing the aluminum nitride side of the carrier against a prepreg layer. If needed, the copper foil can be etched to free the aluminum nitride (see FIG. 2 and FIG. 3) or structured (see FIG. 6 and FIG. 7). The manufacturing process can be continued. If more aluminum nitride layers are needed, the procedure can be repeated.

Exemplary applications of exemplary embodiments of the invention are automotive applications, lighting applications, applications in terms of mobile devices, as well as power electronics applications. For these and other applications, there is a demand for efficient solutions with in-board heat management. Particularly advantageously may be the implementation of flame-retardant heat spreading layers in mobile devices (such as smartphones, tablets, cameras, Power-Books, etc.).

In an embodiment, hybridization of the PCB may be carried out. It is furthermore possible, according to an exemplary embodiment, to implement inorganic materials in the PCB build up. Moreover, it is possible to increase the heat dissipation capabilities of the PCB without adding neither significant mass nor thickness to the PCB build up (appropriate ceramic layers may have a thickness in the order of magnitude of 5 μm). When manufacturing oxides, nitrides, carbides, semiconductor and DLC layers on the PCB using a carrier structure (sacrificial layer), there is less limitation of deposition temperature.

Highly advantageously, this makes it possible that PCBs can handle more heat and dissipate it more efficiently. A hybrid PCB with improved heat dissipation may be provided. There is further the option for semiconductor material on the PCB build up (exemplary applications relate to diodes and sensors directly built in the PCB stack up).

In the following, a specific implementation of exemplary embodiments of the invention in terms of mounting a light-emitting diode on a PCB will be described. In a corresponding embodiment, a highly thermally conductive and electrically insulating or semiconductive structure may also function as a transparent dielectric or semiconductive layer. More specifically, a PCB with ultra-thin transparent dielectric layers for the installation of LEDs on the surface thereof is provided. As mentioned above, ceramics can be used as heat sinks for LEDs since they are dielectrics and are good thermal conductors. Aluminum nitride is, in this context, highly advantageous because of its attractive properties such as chemical stability, high thermal conductivity, electrical isolation, wide band gap (about 6.2 eV), and high acoustic velocity. Therefore, aluminum nitride films have a great potential for microelectronic and optoelectronic devices. Aluminum nitride films may not only be applied to surface passivation of semiconductors and insulators, but also to optical devices in the ultraviolet spectral region, acousto-optic devices and surface acoustic wave devices.

According to an exemplary embodiment, ultra-thin ceramic layers that can be applied in the PCB surface may be used to electrically isolate the LEDs to a reflective surface (such as polished aluminum). Achievable ad-vantages are that the ultra-thin ceramic layers (with a thickness from below 100 nm up to 5 μm or more) can be transparent to the range of the LEDs light emitting frequencies and may still transport heat above 30 W/mK depending on coating parameters and substrate. They also can protect the surface from corrosion. A corresponding application of thin film ceramics on a PCB structure can be done with deposition methods such as PVC, PCVD, DC Arc, Sputtering, application of nanoparticles, sintering, etc. In particular, it is possible to use ultra-thin ceramic layers that can be applied in the PCB surface to electrically isolate the LEDs to a reflective metallic surface (such as polished aluminum) and still work as thermal path from the LED (as a hot spot) to a metallic base (heat sink) of the lighting PCB build up.

The layers can be formed with different ceramic materials (such as nitrides (for example aluminum nitride), carbides (such as silicon carbide) and oxides (such as aluminum oxide), for example) via PVD, PECVD, DC Arc Sputtering, application of nanoparticles, etc. It is also possible to use other materials like DLC or Graphene. A ceramic layer can be applied in between any other layers in the PCB (such as FR4/FR4, FR4/copper or copper/copper) depending on the requirements of a certain application. The mentioned ceramics can have an approximate thickness from under 100 nm up to 5 μm thicknesses and can be structured with methods such as chemical and plasma etching, for example. Ceramics materials may present a very good electrical insulation, which is desired in the case of high-power LEDs.

Hence, an exemplary embodiment of the invention provides a transparent inorganic dielectric. Moreover, a transparent highly thermally conductive dielectric is provided. According to an embodiment, inorganic materials may be implemented in the PCB build up. Furthermore, it is possible to obtain an increase on the heat dissipation capabilities of the PCB without adding significant mass nor thickness to the PCB build up (for instance, the implemented ceramic layers may have a thickness in the order of 5 µm).

In an embodiment, a transparent dielectric with high thermal conductivity may be used for LED based lighting. An enhanced heat diffusion may be obtained via the dielectric. Hence, more effective cooling of LEDs can be achieved. It is furthermore possible to obtain a passivation of the reflective structure against oxidation. A reflective structure may be integrated with the FR4 PCB body. An advantage of ceramics insulation over printed solutions is the reduction of defects (pinholes) due to the uniformity of the ceramic layer. A further advantage of some of these ceramic materials (especially aluminum nitride) is that no adhesive promotion material (such as titanium) or pre-treatment (such as ion bombardment) has to be implemented. Some ceramics can also be applied directly on prepreg, aluminum or copper without any pre-treatment nor adhesive promotion material. The electric isolation of embedded components or boards can be done with a single coating process after an assembly of a heat sink body. The processing of such heat spreading layers can be easier for a PCB manufacturer. Copper can be also directly applied on the ceramics with a metallization process. The described ultra-thin ceramic layers can also be used as passivation to the surface of the PCB and reflective structures, thereby efficiently avoiding oxidation, humidity, etc. These ultra-thin ceramic layers can also work as UV filter to avoid material degradation.

FIG. 1 to FIG. 4 show cross-sectional views of structures obtained during carrying out a method of manufacturing a constituent 350 and finally a component carrier 300 implementing such a constituent 350. The manufactured component carrier 300 is configured for carrying a surface mounted component (see reference numeral 1000 in the below described embodiments) according to an exemplary embodiment of the invention. Also, an embedding of a component 1000 in the manufactured component carrier 300 is possible.

In order to obtain the structure shown in FIG. 1, an electrically conductive structure 100, which is here embodied as a copper foil, is used as a sacrificial base or support. Subsequently, a highly thermally conductive and electrically insulating or semiconductive structure 102, which is here embodied as an aluminum nitride film, is formed by deposition (for instance PVD or sputtering) on the electrically conductive structure 100. Forming the highly thermally conductive and electrically insulating or semiconductive structure 102 on the electrically conductive structure 100 involves high processing temperatures of for example 300° C. or above. The highly thermally conductive and electrically insulating or semiconductive structure 102 may be formed directly on the electrically conductive structure 100 as a homogeneous thin layer with a thickness of for example 500 nm and may have a thermal conductivity of more than 8 W/mK.

The mentioned deposition temperature would be incompatible with integrity of a thermally conductive and electrically insulating structure 200 (see FIG. 2) in form of a prepreg foil. Such a prepreg foil comprises a resin matrix with embedded glass fibers, wherein the resin may be in B-stage, i.e. uncured. Upon lamination of the thermally conductive and electrically insulating structure 200 with other structures, the resin may melt, cross-link and re-solidify, thereby forming a connection with the other structures. If the highly thermally conductive and electrically insulating or semiconductive structure 102 was deposited directly on the thermally conductive and electrically insulating structure 200, the high processing temperatures of 300° C. or more could unintentionally modify the thermally conductive and electrically insulating structure 200 so as to deteriorate its properties, in particular in terms of lamination capability.

In order to obtain the structure shown in FIG. 2, a thermally conductive and electrically insulating structure 200, here embodied as prepreg foil, is positioned on the highly thermally conductive and electrically insulating or semiconductive structure 102. The prepreg material has a lower thermal conductivity (for instance about 0.5 W/mK) than the highly thermally conductive and electrically insulating or semiconductive structure 102.

Moreover, the thermally conductive and electrically insulating structure 200 may be connected to a core 202 as fully cured structure covered with electrically conductive layer structures 204 on both opposing main surfaces thereof. The core 202 may for example be made of cured FR4 material. The electrically conductive layer structures 204 may be copper foils.

Subsequently, the layer stack composed of elements 100, 102, 200, 204, 202, 204 are interconnected with one another by lamination, i.e. by the application of mechanical pressure supported by a temperature increase. By this application of pressure and heat, resin material of the prepreg layer constituting the thermally conductive and electrically insulating structure 200 will cross-link and establish a connection between the highly thermally conductive and electrically insulating or semiconductive structure 102 on the one hand and the thermally conductive and electrically insulating structure 200 on the other hand.

In order to obtain the structure shown in FIG. 3, the electrically conductive structure 100 is removed completely from the laminated stack obtained according to FIG. 2. This removal may be accomplished by etching, by grinding, or by peeling.

As can be taken from FIG. 3 as well, a further thermally conductive and electrically insulating structure 200, here embodied as a further prepreg foil, can be attached to an exposed lower main surface of the highly thermally conductive and electrically insulating or semiconductive structure 102, in particular by lamination.

A constituent 350 of the component carrier 300 according to an exemplary embodiment of the invention is provided by the interconnected (here laminated) double layer stack of the highly thermally conductive and electrically insulating or semiconductive structure 102 in combination with the thermally conductive and electrically insulating structure 200 on top thereof. Such a constituent 350 may also be separated from the remainder of the structure shown in FIG. 3 and provided as a semi-finished product in form of a separate double layer structure which can be used as an element for any desired component carrier 300 to be designed.

A further result of the procedure described referring to FIG. 3 is the provision of a highly thermally conductive and electrically insulating or semiconductive structure 102 covered on both main surfaces thereof by a respective thermally conductive and electrically insulating layer structure 200 of prepreg, as indicated by reference numeral 370 (which can also be used as a constituent for a component carrier 300). The result of the described manufacturing procedure is the component carrier 300 shown in FIG. 3.

In order to obtain the structure shown in FIG. 4, a further core 202 is provided, wherein both opposing main surfaces of the further core 202 may be covered with a respective further electrically conductive layer structure 204 such as a further copper foil. The elements shown in FIG. 4 may be connected to one another by lamination.

Although not shown in the figures, further procedures such as via formation, patterning certain layers, embedding components, may be accomplished with the illustrated component carrier 300.

FIG. 5 to FIG. 8 show cross-sectional views of structures obtained during carrying out a method of manufacturing a component carrier 300 according to another exemplary embodiment of the invention.

In order to obtain the structure shown in FIG. 5 and the structure shown in FIG. 6, the same procedures as described above referring to FIG. 1 and FIG. 2 can be carried out.

In order to obtain the structure shown in FIG. 7, the electrically conductive structure 100 is however not removed entirely (as described above referring to FIG. 3), but it removed only partially by patterning. Patterning may involve a lithography and etching procedure.

In order to obtain the structure shown in FIG. 8, the four lowermost layer structures shown in FIG. 4 (see reference numerals 200, 204, 202, 204) are attached to a bottom of the laminated stack shown in FIG. 7 and are interconnected by lamination. Hence, the electrically conductive structure 100 serves only partially as a sacrificial layer according to FIG. 5 to FIG. 8, and is partially maintained as a patterned electrically conductive layer in the final component carrier 300.

FIG. 9 shows a plan view of a readily manufactured product or a semi-finished product 900 on a panel level based on which a component carrier 300 according to an exemplary embodiment of the invention can be formed. FIG. 9 shows a plan view of an aluminum reflective structure with transparent dielectric material with highly thermally conductive properties, such as a thin layer of aluminum nitride, on top thereof. Copper contacts can be made with metal evaporation or direct printing on aluminum nitride.

The structure shown in FIG. 9 can already be used as a product, wherein the aluminum nitride structure may be used both as reflector and for heat spreading for LEDs. Advantageously, both the transparency and the electrical insulation of aluminum nitride may be used at the same time. FIG. 9 shows actually one possible use of the disclosed technology for LEDs installed on a reflective structure (aluminum for example), where the transparent layer of ceramics may be applied to provide electrical insulation as well.

Alternatively, an electrically insulating structure (for instance made of prepreg or FR4) may be applied on the aluminum nitride layer, so that the resulting structure may serve as a semi-finished product 900 for manufacturing a component carrier 300. Hence, the embodiment of FIG. 9 shows a direct application of aluminum nitride on an aluminum plate. The aluminum plate may work directly as heat sink, and the aluminum nitride layer may function as dielectric.

Figure 10:
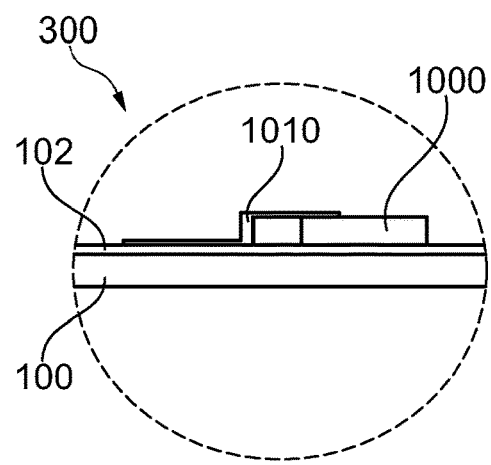
FIG. 10 shows a cross-sectional view of a detail of a component carrier with a surface mounted light-emitting diode according to an exemplary embodiment of the invention.

FIG. 10 shows a cross-sectional view of a detail of a component carrier 300 with a surface mounted light-emitting diode as an example for a surface mounted component 1000 according to an exemplary embodiment of the invention.

The component carrier 300 is configured for carrying the component 1000. In the central portion of the component carrier 300 shown in FIG. 10, an aluminum nitride layer embodying an optically transparent, highly thermally conductive and electrically insulating or semiconductive structure 102 is arranged directly on an electrically conductive structure 100 such as an aluminum body. Although not shown in FIG. 10, electrically insulating PCB material (see reference numeral 200 in FIG. 11) may be arranged laterally surrounding the electrically conductive structure 100. In other words, the electrically conductive structure 100 may be laterally embedded in electrically insulating PCB material. As in FIG. 11, part of the optically transparent, highly thermally conductive and electrically insulating or semiconductive structure 102 may hence be directly located on the mentioned electrically insulating PCB material, and another part is located directly on the aluminum material of the electrically conductive structure 100.

According to FIG. 10, the highly thermally conductive and electrically insulating or semiconductive structure 102 is optically transparent as a result of its material selection (e.g., Aluminum nitride or AlN) and its very small thickness of for example 100 nm. The highly thermally conductive and electrically insulating or semiconductive structure 102 is arranged on top of the electrically conductive layer structures 100 and on top of the lateral electrically insulating PCB material (not shown in FIG. 10). The light-emitting diode constituting the component 1000 is arranged on top of the highly thermally conductive and electrically insulating or semiconductive structure 102 and is exposed to an environment of the component carrier 300. An electrically conductive contact 1010, shaped as a clip, is coupled to one or more pads of the component 1000 for applying an electric supply signal to the component 1000. The function of the component 300 according to FIG. 10 is similar to that according to FIG. 11 described below.

Figure 11:
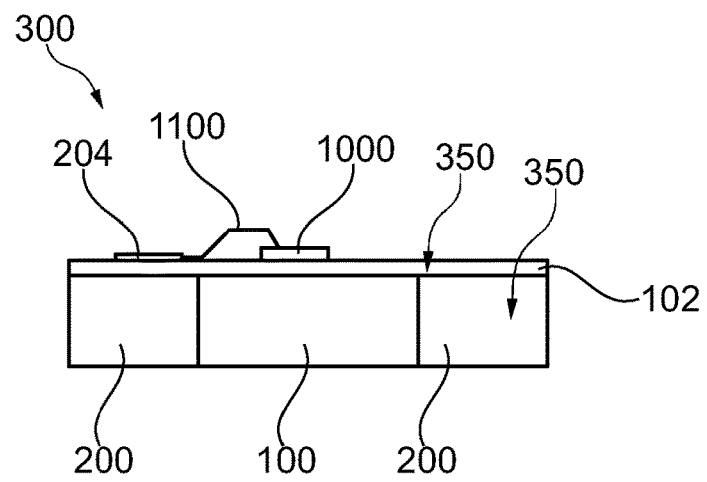
FIG. 11 shows a cross-sectional view of a component carrier with surface mounted light-emitting diode according to an exemplary embodiment of the invention.

FIG. 11 shows a cross-sectional view of an entire component carrier 300 with surface mounted light-emitting diode as component 1000 according to an exemplary embodiment of the invention.

According to FIG. 11, pads of the light-emitting diode are contacted via a bond wire 1100 and are thereby electrically connected to a patterned copper layer (see reference numeral 204) on top of the aluminum nitride layer (see reference numeral 102). Although not shown in FIG. 11, a bottom of the shown embodiment may be connected to a heat sink.

During operation, the light emitting diode generates light and heat. The light transmits the transparent highly thermally conductive and electrically insulating or semiconductive structure 102 and is reflected by the polished aluminum structure constituted by reference numeral 100 and propagates upwards so that its light energy is not lost. Any heat dissipated during operation of the light emitting diode can be efficiently removed by the heat removing and heat spreading function of the highly thermally conductive and electrically insulating or semiconductive structure 102.

In order to manufacture the arrangement shown in FIG. 11, the highly thermally conductive and electrically insulating or semiconductive structure 102 is also partially formed on top of the thermally conductive and electrically insulating structure 200. This can be accomplished by a procedure as shown in FIG. 1 to FIG. 8.

Figure 12:
FIG. 12 shows a cross-sectional view of a constituent for a component carrier used as a substitute for a conventional prepreg layer according to an exemplary embodiment of the invention.

FIG. 12 shows a cross-sectional view of a constituent 350 for a component carrier 300 used as a substitute for a conventional prepreg layer according to an exemplary embodiment of the invention. The constituent 350 shown in FIG. 12 can be provided for instance as a standalone double layer 200, 102 which can be used as a constituent for any printed circuit board to be manufactured. It may substitute a conventionally used prepreg layer.

Figure 13:
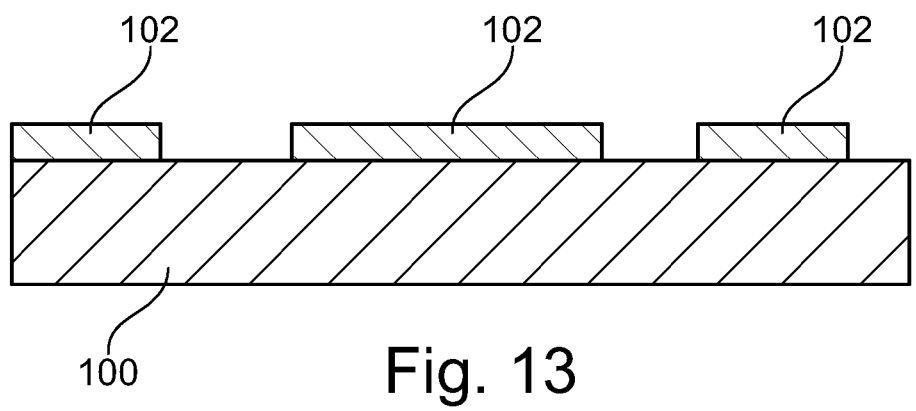
FIG. 13 and FIG. 14 show cross-sectional views of structures obtained during performance of a method of manufacturing a component carrier according to an exemplary embodiment of the invention.
Figure 14:
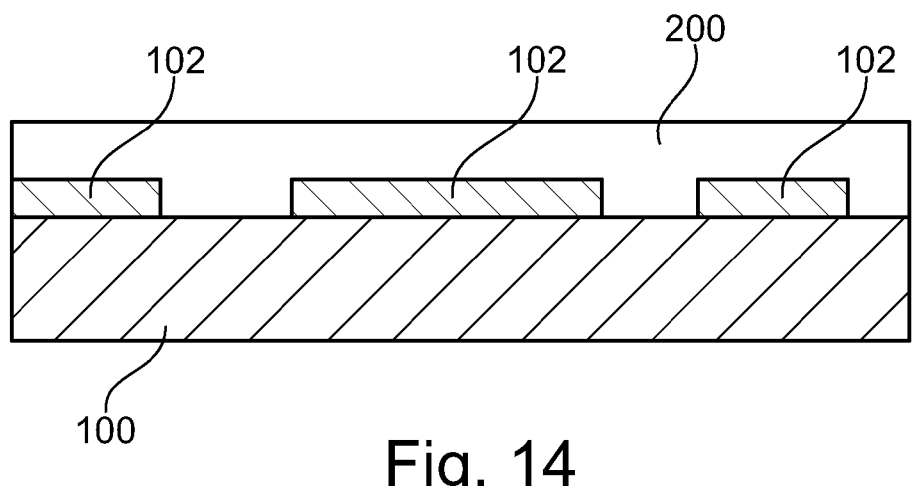

FIG. 13 and FIG. 14 show cross-sectional views of structures obtained during carrying out a method of manufacturing a component carrier 300 according to an exemplary embodiment of the invention.

FIG. 13 substantially corresponds to FIG. 1. However, according to FIG. 13, the highly thermally conductive and electrically insulating or semiconductive structure 102 is formed to only partially (rather than fully, as in FIG. 1) cover the electrically conductive structure 100. This can be accomplished by a mask process.

According to FIG. 14, a thermally conductive and electrically insulating structure 200 is formed to cover the patterned highly thermally conductive and electrically insulating or semiconductive structure 102 as well as exposed portions of the electrically conductive structure 100. Although not shown, the electrically conductive structure 100 may be subsequently removed from the structure shown in FIG. 14, if desired or required.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

The invention claimed is:

1. A manufacturing method of manufacturing a constituent for a component carrier, the method comprising:
   providing an electrically conductive structure;
   forming a highly thermally conductive and electrically insulating or semiconductive structure on the electrically conductive structure;
   subsequently, attaching a thermally conductive and electrically insulating structure, having a lower thermal conductivity than the highly thermally conductive and electrically insulating or semiconductive structure, on an exposed surface of the highly thermally conductive and electrically insulating or semiconductive structure; and
   removing at least part of the electrically conductive structure after attaching the thermally conductive and electrically insulating structure.

2. The manufacturing method according to claim 1, wherein the highly thermally conductive and electrically insulating or semiconductive structure is formed to fully or partially cover the electrically conductive structure.

3. The manufacturing method according to claim 1, wherein the highly thermally conductive and electrically insulating or semiconductive structure is formed on the electrically conductive structure at a high temperature which is incompatible with integrity of the thermally conductive and electrically insulating structure.

4. The manufacturing method according to claim 1, wherein the highly thermally conductive and electrically insulating or semiconductive structure is formed on the electrically conductive structure by at least one of the group consisting of sputtering, physical vapor deposition, chemical vapor deposition, plasma enhanced chemical vapor deposition, application of nanoparticles, sintering, and electric arc deposition.

5. The manufacturing method according to claim 1, wherein the attaching is accomplished by lamination.

6. The manufacturing method according to claim 1, wherein the highly thermally conductive and electrically insulating or semiconductive structure is formed as a thin layer with a thickness of less than or equal to 10 μm.

7. The manufacturing method according to claim 1, wherein the electrically conductive structure is removed completely.

8. The manufacturing method according to claim 1, wherein the electrically conductive structure is patterned so that a patterned electrically conductive structure remains attached to the highly thermally conductive and electrically insulating or semiconductive structure by lithography and etching.

9. The manufacturing method according to claim 1, wherein the highly thermally conductive and electrically insulating or semiconductive structure on the electrically conductive structure comprises at least one of the group consisting of an inorganic material, a ceramic, a metal oxide, a metal carbide, a metal nitride, aluminum oxide, aluminum nitride, diamond like carbon, and graphene.

10. The manufacturing method according to claim 1, comprising at least one of the following features:
   wherein the electrically conductive layer structure comprises at least one of the group consisting of copper, aluminum, nickel, silver, gold, palladium, and tungsten, any of the mentioned materials being optionally coated with supra-conductive material such as graphene;
   wherein the thermally conductive and electrically insulating structure comprises at least one of the group consisting of resin, reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

11. The manufacturing method according to claim 1, comprising at least one of the following features:
   wherein, prior to the attaching, the thermally conductive and electrically insulating structure is connected to a fully cured structure such as a core or a multi-layer, covered with at least one electrically conductive layer structure;
   wherein the highly thermally conductive and electrically insulating or semiconductive structure is configured to be optically transparent;
   wherein the electrically conductive structure is polished before forming the highly thermally conductive and electrically insulating or semiconductive structure.

12. The manufacturing method according to claim 1, wherein the highly thermally conductive and electrically insulating or semiconductive structure is configured to suppress copper migration in the component carrier.

13. A method of manufacturing a component carrier for carrying at least one component, the method comprising:
   forming at least one constituent of the component carrier by
   providing an electrically conductive structure;
   forming a highly thermally conductive and electrically insulating or semiconductive structure on the electrically conductive structure;
   subsequently, attaching a thermally conductive and electrically insulating structure, having a lower thermal conductivity than the highly thermally conductive and electrically insulating or semiconductive structure, on an exposed surface of the highly thermally conductive and electrically insulating or semiconductive structure;
   removing at least part of the electrically conductive structure after attaching the thermally conductive and electrically insulating structure; and
   forming a laminated stack of a plurality of electrically conductive layer structures and a plurality of electrically insulating layer structures, wherein at least one of the electrically insulating layer structures is provided by at least part of the at least one constituent.

14. The method according to claim 13, wherein at least one of the electrically conductive layer structures is provided by part of the at least one constituent.

15. A manufacturing method of manufacturing a constituent for a component carrier, the method comprising:
  providing an electrically conductive structure;
  forming a highly thermally conductive and electrically insulating or semiconductive structure on the electrically conductive structure;
  subsequently, attaching a thermally conductive and electrically insulating structure, having a lower thermal conductivity than the highly thermally conductive and electrically insulating or semiconductive structure, on an exposed surface of the highly thermally conductive and electrically insulating or semiconductive structure;
wherein the method further comprises at least one of the following features:
  wherein, prior to the attaching, the thermally conductive and electrically insulating structure is connected to a fully cured structure such as a core or a multi-layer, covered with at least one electrically conductive layer structure;
  wherein the highly thermally conductive and electrically insulating or semiconductive structure is configured to be optically transparent;
  wherein the electrically conductive structure is polished before forming the highly thermally conductive and electrically insulating or semiconductive structure.

* * * * *